United States Patent
Ha (10) Patent No.: US 9,431,110 B2
(45) Date of Patent: Aug. 30, 2016

(54) COLUMN ADDRESS DECODING

(71) Applicant: Intel Corporation, Santa Clara, CA (US)

(72) Inventor: Chang W. Ha, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 13/627,164

(22) Filed: Sep. 26, 2012

(65) Prior Publication Data

US 2014/0089623 A1 Mar. 27, 2014

(51) Int. Cl.
| | | |
|---|---|---|
| *G11C 7/00* | (2006.01) | |
| *G11C 16/08* | (2006.01) | |
| *G11C 16/24* | (2006.01) | |
| *G11C 15/00* | (2006.01) | |

(52) U.S. Cl.
CPC ............... *G11C 16/08* (2013.01); *G11C 16/24* (2013.01); *G11C 15/00* (2013.01)

(58) Field of Classification Search
CPC ....... G06F 11/20; G06F 11/16; G11C 7/1039
USPC ........................................................ 711/169
See application file for complete search history.

(56) References Cited

U.S. PATENT DOCUMENTS

| | | | | |
|---|---|---|---|---|
| 6,219,280 | B1* | 4/2001 | Naganawa | 365/185.22 |
| 8,254,203 | B2* | 8/2012 | Park | 365/238.5 |
| 2002/0085417 | A1* | 7/2002 | Pekny et al. | 365/185.11 |
| 2003/0065900 | A1* | 4/2003 | Mes | G11C 7/1039 |
| | | | | 711/169 |
| 2012/0057415 | A1* | 3/2012 | Cho | 365/189.07 |
| 2012/0072768 | A1* | 3/2012 | Morris et al. | 714/6.2 |
| 2012/0151252 | A1* | 6/2012 | Harris et al. | 714/6.13 |
| 2012/0260148 | A1* | 10/2012 | Hughes et al. | 714/773 |
| 2013/0326312 | A1* | 12/2013 | Lee et al. | 714/773 |
| 2014/0006848 | A1* | 1/2014 | Ramanujan et al. | 714/6.13 |

OTHER PUBLICATIONS

Gutierrez-Osuna, Ricardo, Lecture 16: Address decoding, Microproccesor-based System Design, Wright State University, Jul. 2003, pp. 1-11.*

* cited by examiner

*Primary Examiner* — Ryan Bertram
*Assistant Examiner* — Edmund Kwong
(74) *Attorney, Agent, or Firm* — Alpine Technology Law Group LLC (57) ABSTRACT

Methods, memories and systems to access a memory may include generating an address during a first time period, decoding the address during the first time period, and selecting one or more cells of a buffer coupled to a memory array based, at least in part, on the decoded address, during a second time period.

5 Claims, 7 Drawing Sheets

COLUMN ADDRESS DECODING

BACKGROUND

1. Technical Field

The present subject matter relates to semiconductor memory, and, more specifically, to controlling an access of a memory.

2. Background Art

Many types of semiconductor memory are known in the art. One type of memory is flash memory which stores charge in a charge storage region of a memory cell. One architecture in common use for flash memories is a NAND architecture. In a NAND architecture, two or more memory cells are coupled together into a string, with the individual cell control lines coupled to word lines. A NAND string may be coupled to a bit line at one end of the NAND string.

Another type of memory is phase change memory (PCM). PCMs utilize a phase change material having a non-conductive amorphous state and a conductive crystalline state. A PCM cell may be put into one state or the other to indicate a stored value.

Many types of memory, including flash memory and PCM may organize the memory cells into an array that may have word lines crossing the array in one direction to select rows of memory cells, and bit lines coupled to a column of memory cells crossing the array in an orthogonal direction. In some cases, a row of memory cells may be accessed simultaneously with their state indicated on bit lines. The bit lines may be coupled to a page buffer to temporarily store the data from a row, and the page buffer may be accessed to retrieve data in smaller chunks, such as a byte, which may be provided at an output of the memory device.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1:
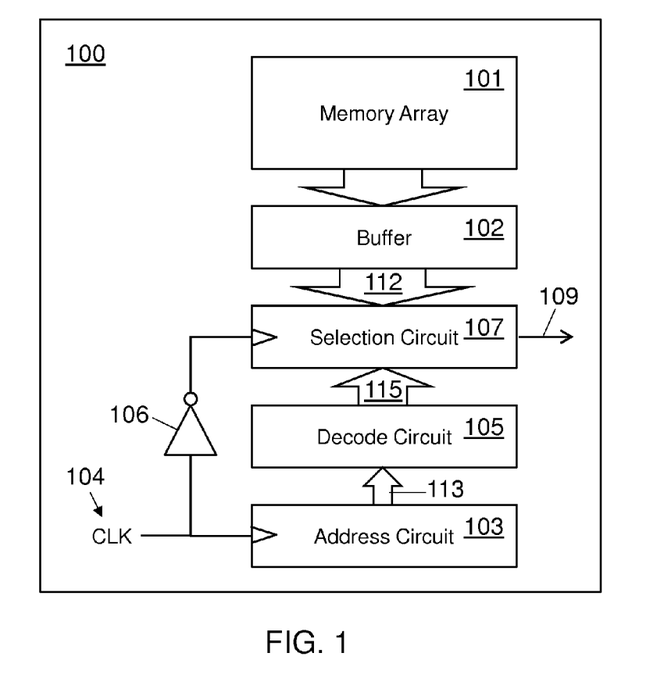
FIG. 1 is a block diagram of an embodiment of a memory.

FIG. 1 is a block diagram of an embodiment of a memory 100. The memory 100 may include a memory array 101 coupled to a buffer 102. If data in the memory array 101 is accessed, such as for a read command or to verify data after a program or erase command, data from the memory array 101 may be latched into the buffer 102. The memory array 101 and the buffer 102 may be of any size, but in some embodiments, the buffer 102 may be able to latch and hold the data from one row of the memory array 101, and may be organized as 'N" elements that are 'M' bits wide, where 'N' and 'M' are commonly powers of 2. In some embodiments the buffer may be referred to as a page buffer. The memory array 101 may utilize any type of volatile or non-volatile memory technology, such as, but not limited to, dynamic random access memory (DRAM), masked read only memory (ROM), floating gate flash, charge trap flash (CTF), nanowire based memory, ferro-electric transistor random access memory (FeTRAM), resistive random access memory (RRAM), phase-change memory (PCM), and PCM with switch (PCMS). The memory array 101 may use any logical architecture, including NAND, NOR, or other logical architecture, and may use any physical embodiment, such as a traditional two dimensional memory array, multiple layers of two-dimensional arrays built on top of each other, vertical stacks of memory cells organized as a three dimensional array, or other physical embodiments.

The memory 101 may include an address circuit 103 to drive an address onto a group of address lines 113 in response to a clock 104. In some embodiments, an initial column address based on an address received from a memory command, such as a read command, a write command, a program command or an erase command, may be loaded into the address circuit 103 as the memory array 101 is being accessed, or concurrently with latching data into the buffer 102. In some embodiments the address circuit 103 may include a counter that may increment the address on a rising edge of the clock 104, causing a new address to be represented on the group of address lines 113 and sent to the decode circuit 105. So generating an address to access the memory array 101 during a first time period, which may be delineated by the clock 104, may be performed by the address circuit 103.

The decode circuit 105 may be coupled to the group of address lines 113 and may drive a group of select lines 115. The decode circuit 105 may be a combinatorial circuit and may include several layers of logic which may provide for a significant amount of delay in some embodiments. In some embodiments, the group of address lines 113 may be subdivided into subsets of address lines for decoding to generate partial decode information on two or more sets of partial select lines that may be a part of the group of select lines 115. So decoding two or more subsets of the group of address lines 113 during the first time period to generate partial decode information on two or more sets of partial select lines may be performed by the decode circuit 105.

The selection circuit 107 may be coupled to the group of select lines 115, and to the output 112 of the buffer 102. A second clock may delineate a second time period. In the example shown, inverter 106 inverts clock 104 to provide to the selection circuit 107, which may respond to the rising edge of the inverted clock. So the first clock may be a first rising edge of the clock 104, and the second clock may be a falling edge of the clock 104. In another embodiment, the first clock may be a first rising edge of the clock 104, and the second clock may be a second rising edge of the clock 104. In other embodiments, the first clock and the second clock may be separate clocks that are 180 degrees out of phase, or the second clock may be a delayed copy of the first clock. While edge-triggered logic may be used in some embodiments, other embodiments may utilize level sensitive latch designs so the first clock may be characterized by the clock 104 in a first logic state, such as high, and the second clock may be characterized by the clock 104 in the opposite logic state, such as low. In some level sensitive designs, two separate clocks, which may be non-overlapping, may be used to delineate the first clock and the second clock.

A single element of the buffer 102, which may be a single cell or may be multiple cells, depending on the embodiment, may be coupled to a portion of the selection circuit. The portion of the selection circuit to select one or more cells of the buffer 102 may be coupled to at least one select line of the group of select lines 115, to select one or more cells of the buffer 102 in response to the second clock. If partial decode information on partial select lines is provided, selecting one or more cells of a buffer 102 coupled to the memory array 101 based, at least in part, on the two or more sets of partial select lines may be performed by the selection circuit 107 during a second time period.

A data output 109 may be coupled to one or more cells of the buffer 102 by the selection circuit 107. The data output 109 may provide data from to the one or more cells of the buffer 102 selected by the selection circuit 107 in response to a read command. In some embodiments, a verification circuit may be coupled to the buffer 102 by the selection circuit 107 to verify that data from the one or more cells of the buffer 102 selected by the selection circuit 107 has an expected value in response to a program or erase command.

Figure 2:
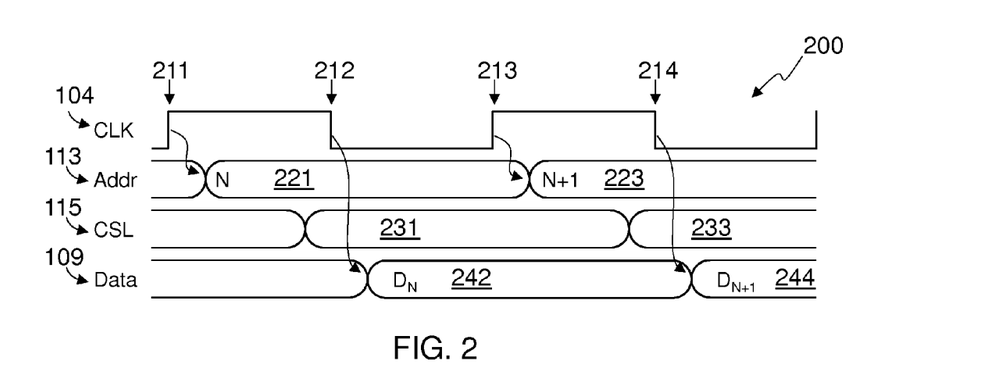
FIG. 2 shows example waveforms for the memory of FIG. 1.

FIG. 2 shows example waveforms 200 for the memory 100 of FIG. 1. The clock (CLK) 104 is shown with a first clock represented by edge 211 and a second clock represented by edge 212. Another set of clocks is included so that edge 213 may be another first clock and the edge 214 may be another second clock. The output of the address circuit 103 is the address (Addr) 113. The address 113 may change to have a value of 'N' in response to the edge 211 and may keep that value for the period 221. The column select lines (CSL) 115 may respond to the change of the address 113 in period 221 by changing to a new value and holding that value for period 231. The new value of the column select lines 115 may be stable before the edge 212. The column select lines 115 may be used by the selection circuit 107 to select one or more cells of the buffer 102, so that the data of that one or more cells, $D_N$, may be presented on the data output 109 in response to the edge 212, so that the selected data, $D_N$, is available for the period 242.

In a similar fashion to the earlier clocks, the address 113 may change to have a value of 'N+1' in response to the edge 213 and may keep that value for the period 223. The column select lines 115 may respond to the change of the address 113 in period 223 by changing to a new value and holding that value for period 233. Data from one or more cells of the buffer 102 identified by 'N+1' may be presented on the data output 109 as $D_{N+1}$ in response to the edge 214 during the period 244.

Figure 3:
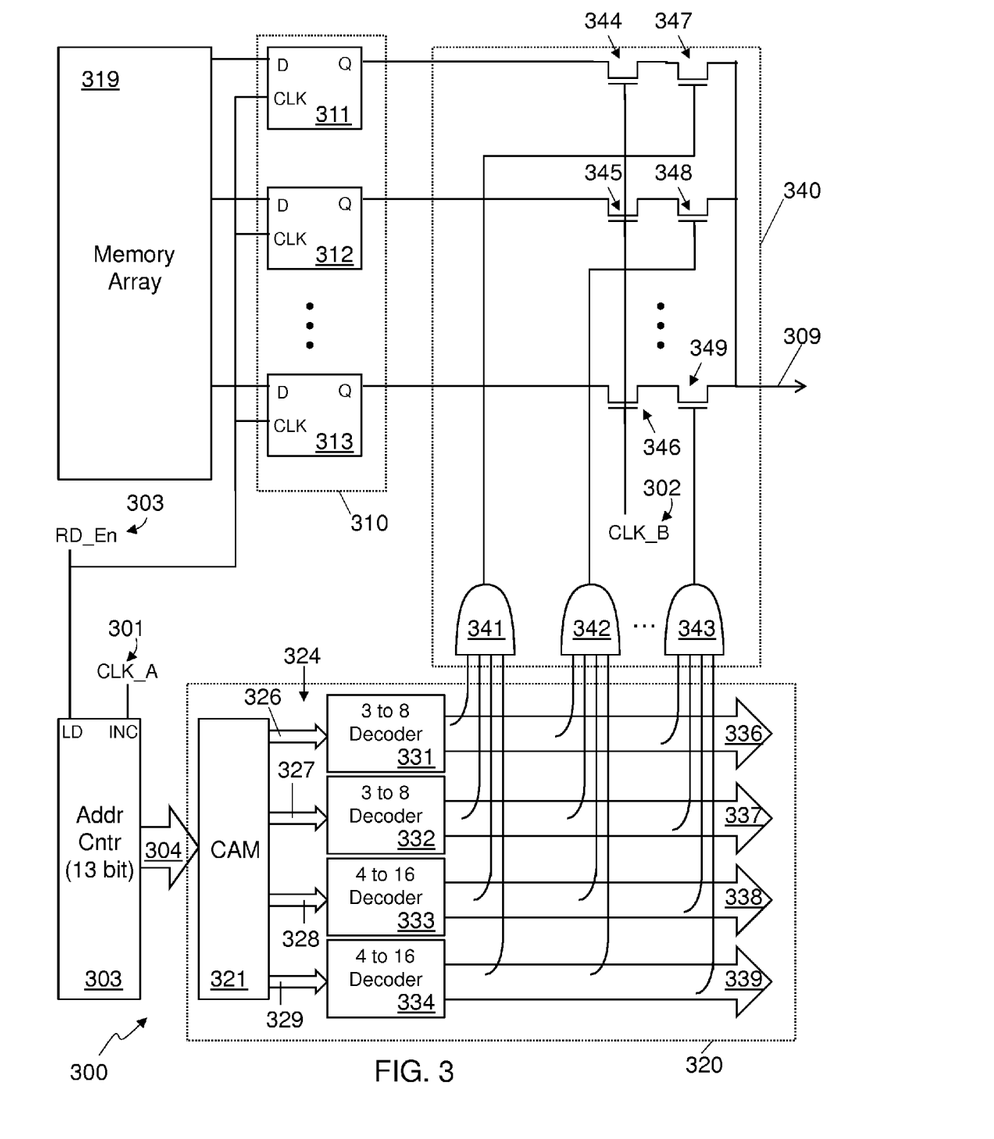
FIG. 3 is a block diagram of an alternative embodiment of a memory.

FIG. 3 is a block diagram of an alternative embodiment of a memory 300. A memory array 319 may be coupled to a buffer 310. Address circuitry, such as the address counter 303, may provide a column address 304 to the decode circuitry 320 in response to the clock (CLK_A) 301. The decode circuitry 320 may generate select lines 336-339 based on the column address 304. A selection circuit 340 may use the select lines 336-339 to select one or more cells from the buffer 310 in response to the clock (CLK_B) 302 to provide an output 309.

Figure 4:
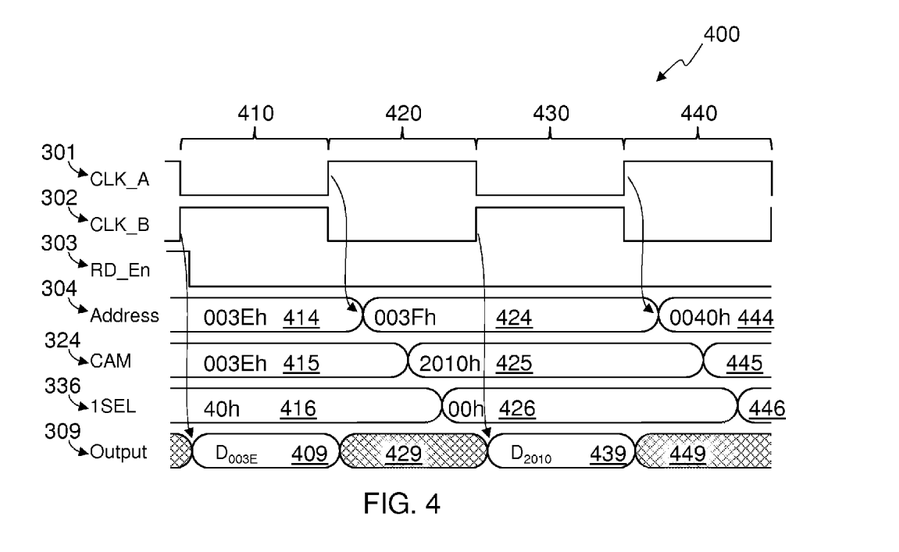
FIG. 4 shows example waveforms for the memory of FIG. 3.

FIG. 4 shows example waveforms 400 for the memory 300 of FIG. 3. Referring now to both FIG. 3 and FIG. 4 together, CLK_A 301 and CLK_B 302 may be driven from a common time base and may have opposite phases. In some embodiments, CLK_A 301 and CLK_B 302 may be non-overlapping, meaning that the two clocks 301, 302 are not both high at the same time. The clocks 301, 302 may delineate different periods of time, such as the first period 410, the second period 420, the third period 430 and the fourth period 440.

A read command, or a verify operation after a write, program or erase command, may initiate a read operation of the memory array 319. The details of the read operation may vary between memory technologies and are not described in detail here. Once the read operation has data available, the read enable (RD_En) line 303 may go from high to low to latch the data from the memory array 319 into the buffer 310. While a wide variation of buffer sizes may be used in various embodiments, in at least one embodiment, the buffer 310 may have $2^{13}$, or 8192 elements that may include 8 individual cells, respectively, for a buffer size of 8 kilobytes (kB) in that embodiment. In the embodiment shown in FIG. 3, some additional locations may be included to allow for remapping of bad address locations, so the buffer may have 8448 locations to provide 256 redundant locations. In FIG. 3, one cell of three separate elements are shown out of the 8448×8 cells that may be included in such an embodiment, a first cell 311 which may be bit 0 of location 003Eh (hexadecimal notation for decimal 62) within the buffer 310, a second cell, 312 which may be bit 0 of location 003Fh within the buffer 310, and a third cell 313 which may be bit 0 of location 2010h within the buffer 310.

The read enable line 303 may also latch an initial column address 'N' into the address counter 303 from control circuitry (not shown) of the memory. The number of bits in the address counter 303 may vary depending on the embodiment, but a 13 bit address counter 303 may be used in the embodiment of FIG. 3. Although some embodiments may utilize edge-triggered logic, the embodiment shown in FIG. 3 may utilize level-sensitive latches, so the initial column address, which may be 003Eh in the example shown in FIG. 4, may already be provided at the output of the counter 303 as the address 304 as shown during time period 414.

The decode circuit may include remap circuitry, in some embodiments, to remap an address of a dysfunctional memory location, column of the memory array 319, or location in the buffer 310, to a memory column and buffer location. Information regarding the dysfunctional memory location, column, or buffer cell, may be stored within the memory device 300. In at least one embodiment, the remap circuitry may include a content addressable memory (CAM) 321, although other embodiments may utilize other types of circuitry to remap the address. The CAM 321 may include tag locations where bad column addresses may be stored, and data locations where remap addresses associated with the bad column addresses may be stored. While various types of CAM may have different characteristics, CAM 321 may take the incoming address 304 and compare that to the addresses stored in the tag locations in the CAM 321. If the incoming address 304 matches an address stored in the tag locations, the remap address associated with the matched tag location may be provided at the output 324 of the CAM 321. If the incoming address 304 does not match any of the addresses stored in the tag locations, the incoming address 304 may be provided at the output 324 of the CAM 321. In the example shown in FIGS. 3 and 4, the CAM 321 may have 256 14 bit tag locations with respective associated 14 bit data locations, and one tag location may have a value of 003Fh with associated data of 2010h stored in the CAM 321. The most significant bit of the input may be tied low to extend the incoming address 304 to 14 bits to be able to address the redundancy in the buffer 310.

So if address 304 has a value of 003Eh during period 414, which may not match a tag in the CAM 321, the address 304 is passed to the output 324 of the CAM 321. A first subset of 3 address lines 326 having a value of 110b (binary notation), a second subset of 3 address lines 327 having a value of 111b, a third subset of 4 address lines 328 having a value of 0000b, and a fourth subset of 4 address lines 329 having a value of 0000b may make up the output 324 of the CAM 321 during period 415. Four 'n' to $2^n$ decoder circuits 331-334 may be respectively coupled to the subsets of address lines 326-329. An 'n' to $2^n$ decoder circuit may have 'n' input lines and $2^n$ outputs, where only one output is active, or high in the embodiment shown. A 3 to 8 decoder 331 may have the first subset of 3 address lines 326 coupled to its inputs and drive a first set of 8 select lines 336, a 3 to 8 decoder 332 may have the second subset of 3 address lines 327 coupled to its inputs and drive a second set of 8 select lines 337, a 4 to 16 decoder 333 may have the third subset of address lines 328 coupled to its inputs and drive a third set of 16 select lines 338, and a 4 to 16 decoder 334 may have the fourth subset of address lines 329 coupled to its inputs and drive a fourth set of 16 select lines 339. The first set of 8 select lines 336, second set of 8 select lines 337, third set of 16 select lines 338, and fourth set of 16 select lines 339 may make up the group of select lines driven by the decode circuit 320 in the embodiment of FIG. 3. In the embodiment shown, select lines may be referred to as partial select lines as the address is partially decoded instead of fully decoded. A waveform for the first set of select lines (1SEL) 336 is shown in FIG. 4 with a value of 40 h during period 416. Other embodiments may perform a full decode of the remapped address 324 in the decoder circuit and have a one-to-one correspondence between the group of select lines and the elements of the buffer. Other embodiments may use different numbers of 'n' to $2^n$ decoder circuits where 'n' can be any number, including, but not limited to 2, 3 or 4, depending on the number of address lines and the number of elements in the buffer to be accessed.

The selection circuit 340 of the example in FIG. 3 may include a four input NAND gate respectively associated with an element of the buffer 310 and a pair of pass transistors respectively associated with a cell of the buffer 310. A NAND gate for a particular element may have as its inputs partial decode lines from the subsets of the remapped address that are asserted if the remapped address matches the location of the associated cell of the buffer 310. The first NAND gate 341 associated with the first latch 311 that is at location 003Eh may have line 6 of the first set of select lines 336, line 7 of the second set of select lines 337, line 0 of the third set of select lines 338, and line 0 of the fourth set of select lines 339 as inputs, which are all high during period 416 so the output of the first NAND 341 may be high during period 416. The second NAND gate 342 associated with the second latch 312 that is at location 003Fh may have line 7 of the first set of select lines 336, line 7 of the second set of select lines 337, line 0 of the third set of select lines 338, and line 0 of the fourth set of select lines 339 as inputs. Because line 7 of the first set of select lines is low during period 416, the output of the second NAND 342 is low during period 416. The third NAND gate 343 associated with the third latch 313 that is at location 2010h may have line 0 of the first set of select lines 336, line 2 of the second set of select lines 337, line 0 of the third set of select lines 338, and line 8 of the fourth set of select lines 339 as inputs, which are all low during period 416, so the output of the third NAND 343 is low during period 416.

The output of the first NAND gate 341 may drive the control gate of the pass transistor 347, the output of the second NAND gate 342 may drive the control gate of the pass transistor 348, and the output of the third NAND gate 343 may drive the control gate of the pass transistor 349. Because of the state of the NAND gates 341-343 described above, pass transistor 347 may be on and the other pass transistors 348, 349 may be off during period 416. CLK_B 302 may drive the control gates of pass transistors 344-346 that may couple the pass transistors 347-349 controlled by the NAND gates 341-343 to respective cells 311-313 of the buffer 310. So during period 410 while CLK_B 302 is high, those pass transistors 344-347 may turn on, and since pass transistor 347 is on, the value in the cell 311, which may be part of the data of location 003Eh, may be passed to the output 309 during period 409. So in at least the embodiment shown, the selection circuit may include logic to select one or more cells of the buffer 310, and the logic may be coupled to at least a single line of a first set of $2^n$ select lines 331 and a single line of a second set of $2^n$ select lines 332, as well as one line from the other sets of select lines 333, 334. At the beginning of period 420, CLK_B 302 goes low, turning off pass transistors 344-346. So while the output 309 may continue to hold the data capacitively in some embodiments, the value of the output 309 may be unknown during period 429 in other embodiments, or may be driven from another source, such as an output of a second buffer associated with a second memory array.

CLK_A 301 goes high at the beginning of period 420 which may cause the address counter 303 to increment the address 304 in response to CLK_A 301 going high. In the example shown, the address may switch from 003Eh to 003Fh after a delay due to the speed of the address counter 303 so that the address 304 has a value of 003Fh during period 424. Because the CAM 321 has 003Fh stored in one of its tag locations, the output of the CAM 321 may provide the data associated with that tag location, which may be 2010h, on the output 324 after a delay. The delay of the CAM 321 may be much larger than the delay due to the address counter 303, the decoders 331-334, or the NAND gates 341-343 and may be a limiting factor on the speed of the clocks 301, 302 in some embodiments. With the output 324 of the CAM 321 having a value of 2010h, line 0 of the first set of select lines 336, line 2 of the second set of select lines 337, line 0 of the third set of select lines 338, and line 8 of the fourth set of select lines 339 may be high during period 426, so the third NAND gate 323 may turn on pass transistor 349 while the other NAND gates 341, 342 may turn off pass transistors 347, 348.

During period 430, CLK_A 301 is low, causing the address counter 303 to hold its data, and CLK_B 302 is high, turning on pass transistors 344-346. Because the pass transistor 349 is on, the output of the third latch 313 may be coupled to the output 309 and the output 309 may provide at least part of the data associated with location 2010h, which may be the remapped location of logical location 003Fh, during period 439.

During period 440, CLK_A 301 goes high, causing the address counter 303 to increment and drive a value of 0040h as the address 304 during period 444, and CLK_B 302 is low, turning off pass transistors 344-346 and causing the output 309 to potentially be unknown during period 449. The CAM 321 may not have 0040h stored as a tag, so 0040h may be provided as the output 324 of the CAM 321 during the period 445, so that line 0 of the first set of select lines 336, line 0 of the second set of select lines 337, line 1 of the third set of select lines 338, and line 0 of the fourth set of select lines 339 are high during period 446. A NAND gate may be provided that is coupled to those lines to enable another cell of the buffer 310 to be coupled to the output 309 during a subsequent period.

Figure 5:
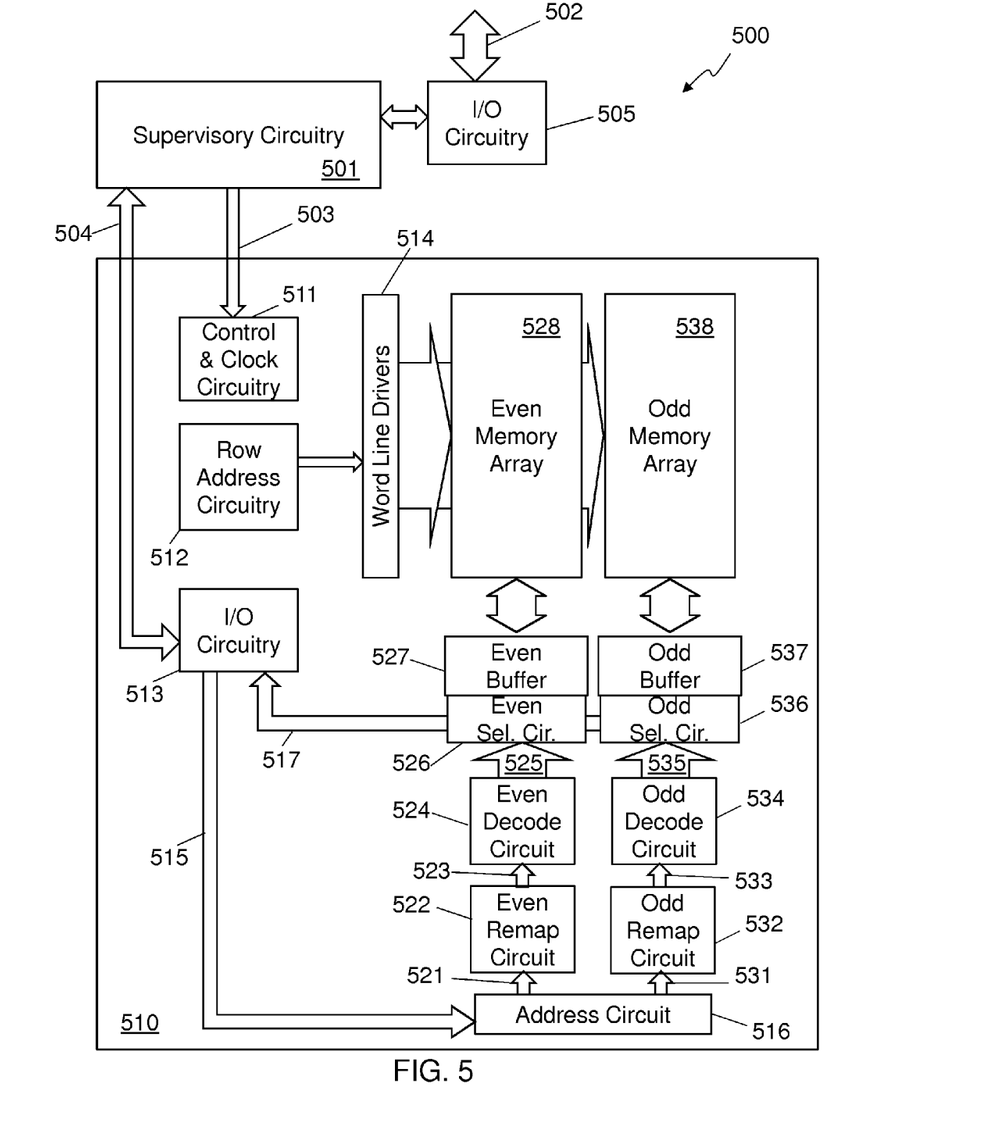
FIG. 5 is a block diagram of an embodiment of an electronic system.

FIG. 5 is a block diagram of an embodiment of an electronic system 500 with memory 510. Supervisory circuitry 501 is coupled to the memory device 510 with control/address lines 503 and data lines 504. In some embodiments, data and control may utilize the same lines. The supervisory circuitry 501 may be a processor, microprocessor, microcontroller, finite state machine, or some other type of controlling circuitry. The supervisory circuitry 501 may execute instructions of a program in some embodiments. In some embodiments, the supervisory circuitry 501 may be integrated in the same package or even on the same die as the memory device 510. In some embodiments, the supervisory circuitry 501 may be integrated with the control circuitry 511, allowing some of the same circuitry to be used for both functions. The supervisory circuitry 501 may have external memory, such as random access memory (RAM) and read only memory (ROM), used for program storage and intermediate data or it may have internal RAM or ROM. In some embodiments, the supervisory circuitry 501 may use the memory device 510 for program or data storage. A program running on the supervisory circuitry 501 may implement many different functions including, but not limited to, an operating system, a file system, memory block remapping, and error management.

In some embodiments an external connection 502 is provided. The external connection 502 is coupled to input/output (I/O) circuitry 505 which may then be coupled to the supervisory circuitry 501 and allows the supervisory circuitry 501 to communicate to external devices. In some embodiments, the I/O circuitry 505 may be integrated with the supervisory circuitry 501 so that the external connection 502 is directly coupled to the supervisory circuitry 501. If the electronic system 500 is a storage system, the external connection 502 may be used to provide an external device with storage. The electronic system 500 may be a solid-state drive (SSD), a USB thumb drive, a secure digital card (SD Card), or any other type of storage system. The external connection 502 may be used to connect to a computer or other intelligent device such as a cell phone or digital camera using a standard or proprietary communication protocol. Examples of computer communication protocols that the external connection 502 may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

If the electronic system 500 is a computing system, such as a mobile telephone, a tablet, a notebook computer, a set-top box, or some other type of computing system, the external connection 502 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 510 may receive commands generated by the supervisory circuitry 501 to access the memory over the control/address lines 503 and the data lines 504. Address lines and control lines 503 may be received and decoded by control circuitry 511, I/O circuitry 513 and row address circuitry 512 coupled to the word line drivers which may select a one or more rows of the even memory array 528 and/or the odd memory array 538. Other embodiments may have a single memory array or more than two memory arrays. An even buffer 527 may be coupled to the even memory array 528 and an odd memory buffer 537 may be coupled to the odd memory array 538. The I/O control and clock circuitry 511 may initiate an access of the memory arrays 528/538 in response to memory command and may generate alternating even clock periods and odd clock periods, the details of which may vary according to the embodiment and may include a single clock line, two clock lines to provide non-overlapping clocks or two clock out of phase with each other, multiple copies of the one or more clock lines, and/or other clocking techniques. I/O circuitry 513 may couple to the data lines 504 allowing data to be received from and sent to the supervisory circuitry 501.

The memory 510 may include an address circuit 516 to generate an even address (Addr_E) 521 that changes in the even clock periods and an odd address (Add_O) 531 that changes in the odd clock periods. Some embodiments may include even remap circuitry 522 to remap the even address 521 to an even remapped address 523, and odd remap circuitry 532 to remap the odd address 531 to an odd remapped address 533. The even remap circuitry 522 and the odd remap circuitry 532 may include content addressable memory in some embodiments. Other embodiments may not include remap circuits and may simply provide the even address 521 as the even remapped address 523 and the odd address 531 as the odd remapped address 523.

The memory 510 may also include even decode circuitry 524 to decode the even remapped address 523, and odd decode circuitry 534 to decode the odd remapped address 533. The even decode circuitry 524 may provide the decoded even address as even column select lines (CSL_E) 525 to even selection circuitry 526 and the odd decode circuitry 534 may provide the decoded odd address as odd column select lines (CSL_O) 535 to odd selection circuitry 536. In some embodiments the decoded even address and the decoded odd address may be a partially decoded addresses created by two or more 'n' to 2n decoder circuits with a 'n' to $2^n$ decoder circuit coupled to a subset of 'n' address lines of the group of address lines and driving a set of $2^n$ select lines as illustrated by the example in FIG. 3.

The even selection circuitry 526 may include logic to select one or more cells of the even buffer 527 during the odd clock periods based, at least in part, on the decoded even address 525, and the odd selection circuitry 536 may include logic to select one or more cells of the odd buffer 537 during the even clock periods based, at least in part, on the decoded odd address 535. If the decoded addresses are partially decoded addresses, the even selection circuit and the odd selection circuit may include logic to identify one or more cells of the respective buffer, and the logic may be coupled to at least a single line of a first set of $2^n$ select lines and a single line of a second set of $2^n$ select lines. Data from the selected cells may be provided on the data lines 517.

The system illustrated in FIG. 5 has been simplified to facilitate a basic understanding of the features of the system. Many different embodiments are possible including using a single supervisory circuitry 501 to control a plurality of memory devices 510 to provide for more storage space. Additional functions, such as a video graphics controller driving a display, and other devices for human oriented I/O may be included in some embodiments.

Figure 6:
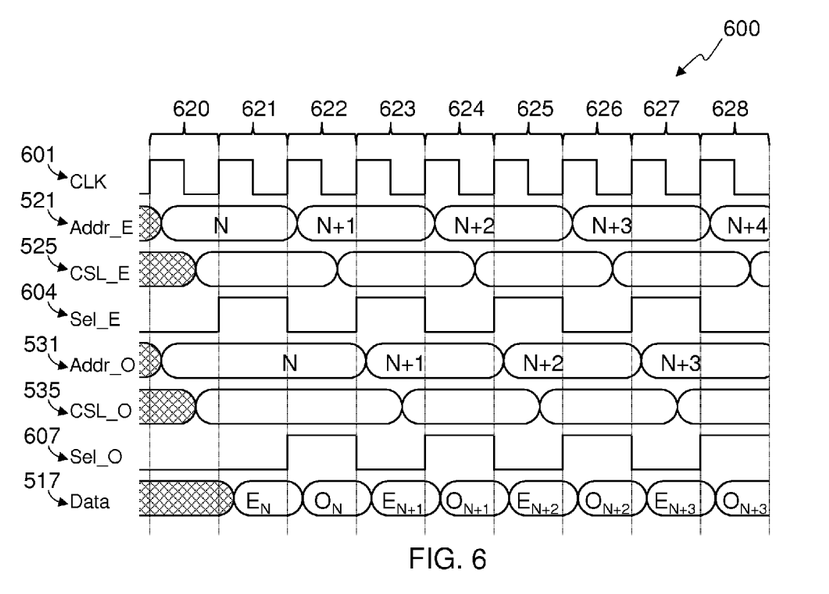
FIG. 6 shows example waveforms for the memory used in the electronic system of FIG. 5.

FIG. 6 shows example waveforms 600 for the memory used in the electronic system of FIG. 5. A clock (CLK) 601 may provide for the different clock periods 621-629 alternating between even clock periods 620, 622, 624, 626, 628 and odd clock periods 621, 623, 625, 627. An initial address 'N' may be loaded into the address circuit 516 over data path 515 during clock period 620 and may be provided for both the even address 521 and the odd address 531. The even address 521 and odd address 531 may both be remapped and decoded to provide even column select lines 525 and odd column select lines 535 during clock period 620. During clock period 621 an even select waveform 604, which may or may not be an actual waveform generated in some embodiments, may be high to signify that one or more cells from the even buffer 527 are to be selected and sent as data $E_N$ on the data lines 517. The odd address 531 may not change during the clock period 621, even though it is an odd clock period, due to it being the start of an access.

During clock period 622 the even address 521 may change. Some embodiments may have different algorithms for changing the address through an access but some embodiments may simply increment the address, so the even address 521 may change to N+1 during clock period 622. As shown by the odd select waveform 607, which may or may not be an actual waveform generated in some embodiments, one or more cells of the odd buffer 537 may be selected and sent as data $O_N$ on the data lines 517 during the clock period 622.

Continuing on to clock period 623, the odd address 531 is incremented to N+1 and data from the even buffer 527 is selected and sent on the data lines 517 as data $E_{N+1}$. During clock period 624 the even address 521 is incremented and data $O_{N+1}$ from the odd buffer 537 is sent on the data lines 517, and during the clock period 625 the odd address 531 is incremented to N+2 and the data $E_{N+2}$ from the even buffer 527 is sent on the data lines 517. This may continue with the even address 521 incremented in the even clock periods and the odd address 531 incremented in the odd clock periods, with data from the even buffer 527 provided to the data lines 517 during the odd clock periods and data from the odd buffer 537 provided to the data lines 517 during the even clock periods.

Figure 7:
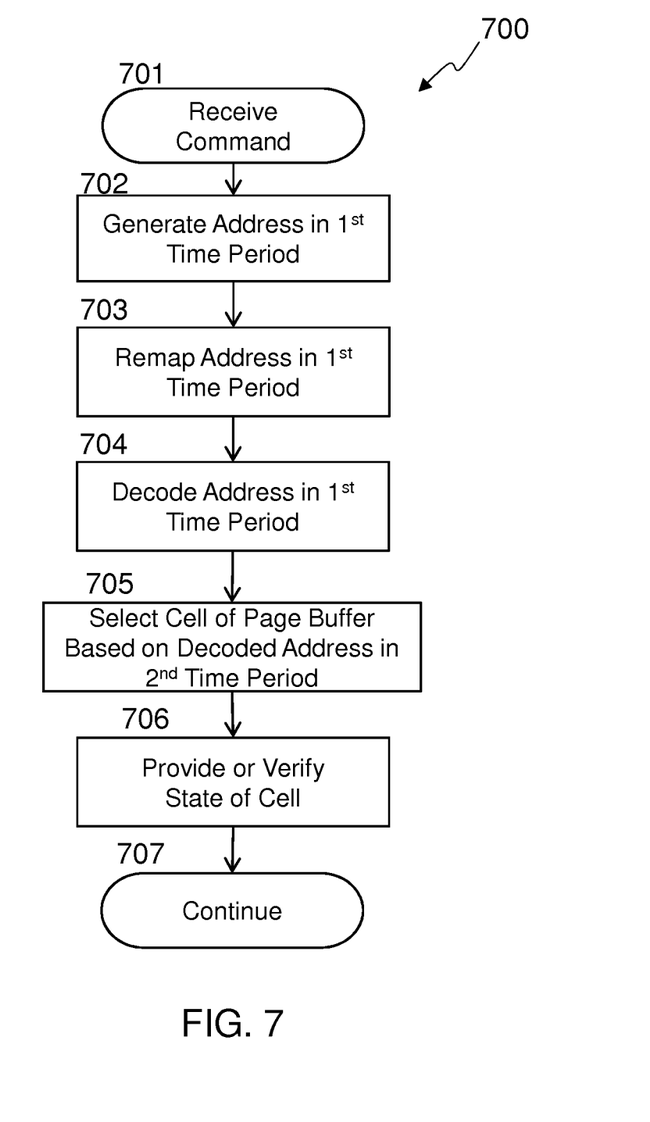
FIG. 7 is a flow chart of an embodiment of a method for accessing memory.

FIG. 7 is a flow chart 700 of an embodiment of a method for accessing memory. Although FIG. 7 illustrates one particular order of the blocks of the method of flow chart 700, more or fewer blocks may be included in various other orders than shown in FIG. 7 for one or more alternative embodiments of the method, and the scope of the claimed subject matter is not limited in this respect. The method may start after receiving a command at block 701. An address may be generated during a first time period at block 702 and, in some embodiments, the address remapped during the first time period at block 703. The remapping may be based, at least in part, on stored information regarding dysfunctional memory locations. The flowchart 700 may continue with decoding the address during the first time period at block 704. At block 705, one or more cells of a buffer coupled to a memory array may be selected during a second time period based, at least in part, on the decoded address. The first and second time periods may be synchronously defined using a clock in some embodiments. In some embodiments, the state of the cell may be provided in response to a read command or verified in response to a program or erase command at block 706 and other operations may continue at block 707.

In some embodiments, the decoding in block 704 may include decoding subsets of address lines to drive sets of partial select lines with the address represented on a group of address lines including two or more subsets of address lines. In such embodiments, the decoding subsets of address lines may include asserting a single line of a set of $2^n$ partial select lines determined by values of a subset of 'n' address lines of the group of address lines. In some embodiments, the selecting in block 705 is also based, at least in part, on a first partial select line from a first set of partial select lines and a second partial select line from a second set of partial select lines.

Figure 8:
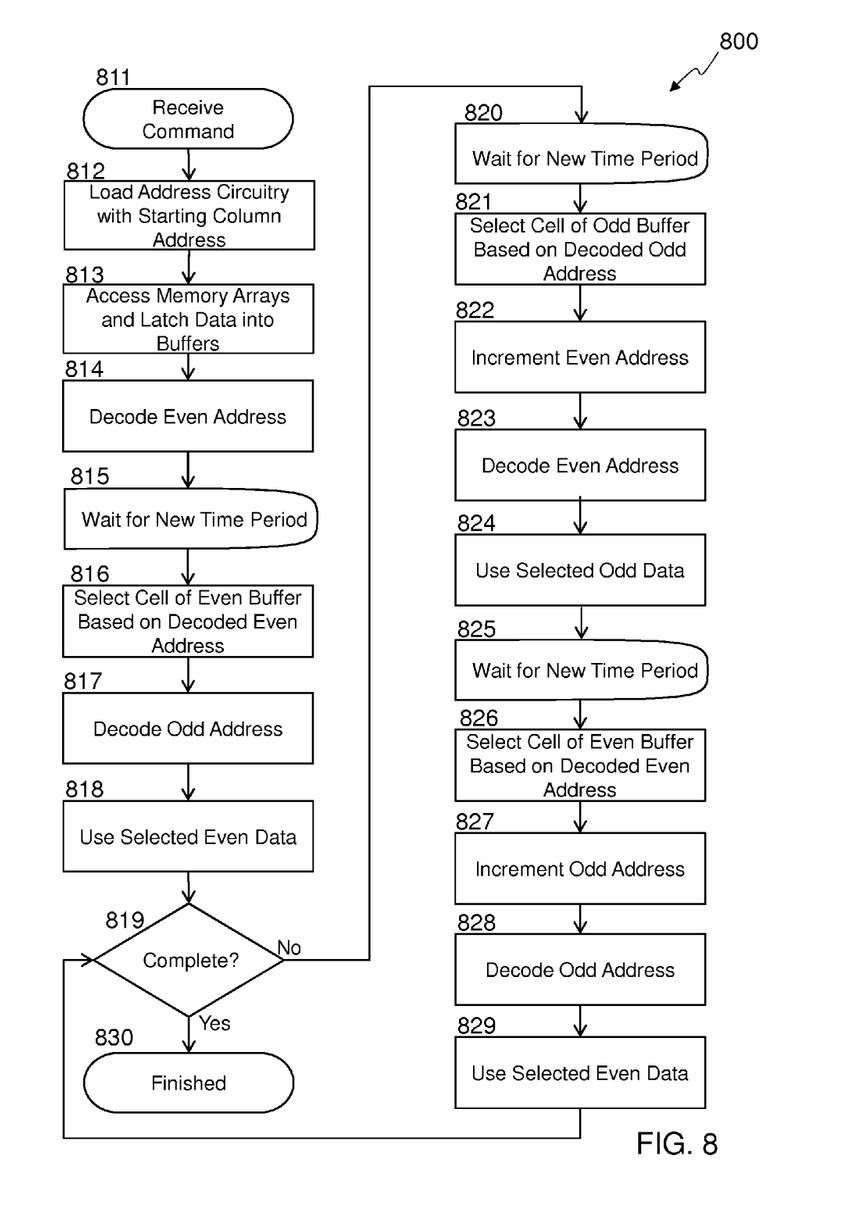
FIG. 8 is a flow chart of an alternative embodiment of a method for accessing memory.

FIG. 8 is a flow chart 800 of an alternative embodiment of a method for accessing memory. Although FIG. 8 illustrates one particular order of the blocks of the method of flow chart 800, more or fewer blocks may be included in various other orders than shown in FIG. 8 for one or more alternative embodiments of the method, and the scope of the claimed subject matter is not limited in this respect. The method may commence if a command is received at block 811. A starting column address may be loaded into the address circuitry at block 812 and even and odd memory arrays may be accessed and data respectively latched into even and odd buffers coupled to the memory array, such as a page buffers, at block 813. An even address, which may be the starting column address, may be decoded at block 814 before waiting for a new time period to start at block 815. The new time period may be signified by a rising clock edge that may or may not be qualified by an enable line in some embodiments.

At block 816, one or more cells of the even buffer may be selected based on the decoded even address and the odd address may be decoded at block 817. At block 818 the selected data from the even buffer may be used by providing the data in response to read command or verifying the data. At block 819, a check is made to see if the access is completed. If the access is complete, the method may be finished at block 830. If the access is not completed, a new time period is awaited at block 820. Once the new time period has started, one or more cells from the odd buffer may be selected based on the decoded odd address at block 821 and the even address may be incremented at block 822 and decoded at block 823. At block 824 the selected data from the odd buffer may be used, and, in some embodiments, a check may be made to see if the access is complete (not shown), before waiting for the next time period at block 825. Once the new time period has started, one or more cells from the even buffer may be selected based on the decoded even address at block 826 and the odd address may be incremented at block 827 and decoded at block 828. At block 829 the selected data from the odd buffer may be used, and a check may be made to see if the access is complete at block 819.

The flowchart and/or block diagrams in the figures help to illustrate the architecture, functionality, and operation of possible implementations of systems, methods and computer program products of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Examples of various embodiments are described in the following paragraphs:

An example method to access a memory may include generating an address to access a memory array during a first time period, the address represented on a group of address lines, decoding two or more subsets of the group of address lines during the first time period to generate partial decode information on two or more sets of partial select lines, and selecting one or more cells of a buffer coupled to the memory array based, at least in part, on the two or more sets of partial select lines during a second time period. Another example method to access memory may include generating an address during a first time period, decoding the address during the first time period, and selecting one or more cells of a buffer coupled to a memory array based, at least in part, on the decoded address, during a second time period. In some example methods, the first time period and the second time period are synchronously defined using a clock. In some example methods, the decoding may include remapping the address based, at least in part, on stored information regarding dysfunctional memory locations. In some example methods, the decoding may include decoding subsets of address lines to drive sets of partial select lines, wherein the address is represented on a group of address lines including two or more subsets of address lines, and the selecting is also based, at least in part, on a first partial select line from a first set of partial select lines and a second partial select line from a second set of partial select lines. In some example methods, the decoding subsets of address lines may include asserting a single line of a set of $2^n$ partial select lines determined by values of a subset of 'n' address lines of the group of address lines. In some example methods, 'n' is 2, 3, or 4. In some example methods, the generating may include incrementing a previous address to generate the address. Some example methods may also include generating a second address during the second time period, decoding the second address during the second time period, and selecting one or more cells of a second buffer coupled to a second memory array based, at least in part, on the decoded second address, during a third time period. Some example methods may also include generating a new address during the third time period, decoding the new address during the third time period, and selecting a different one or more cells of the buffer coupled to the memory array based, at least in part, on the decoded new address, during a fourth time period. In some example methods the address and the new address are presented on a first group of address lines, and the second address is presented on a second group of address lines. Some example methods may also include providing a state of the selected one or more cells of the buffer in response to a read command. Some example methods may also include verifying a state of the selected one or more cells of the buffer in response to a program or erase command. Any combination of the examples of this paragraph may be used in embodiments.

An example memory includes a buffer coupled to a memory array, an address circuit to drive an address onto a group of address lines in response to a first clock, a decode circuit, coupled to the group of address lines, to drive a group of select lines, and a selection circuit coupled to at least one select line of the group of select lines, to select one or more cells of the buffer in response to a second clock. In some example memories, the first clock is a first rising edge of a clock line, and the second clock is a second rising edge of the clock line. In some example memories, the first clock is characterized by a clock line in a first logic state, and the second clock is characterized by the clock line in an opposite logic state than the first logic state. In some example memories, the first clock is about 180 degrees out of phase with the second clock. In some example memories, the second clock may include a delayed copy of the first clock. In some example memories, the decode circuit may include two or more 'n' to $2^n$ decoder circuits, wherein a 'n' to $2^n$ decoder circuit is coupled to a subset of 'n' address lines of the group of address lines and drives a set of $2^n$ select lines, and the selection circuit may include logic coupled to at least a single line of a first set of $2^n$ select lines and a single line of a second set of $2^n$ select lines to select the one or more cells of the buffer. In some example memories, 'n' is 2, 3, or 4. In some example memories, the decode circuitry may include remap circuitry to remap the address to a different address and the decode circuitry drives the group of select lines based, at least in part, on the different address. In some example memories, the remap circuitry may include a content addressable memory. Some example memories may also include a second buffer coupled to a second memory array, a second address circuit to drive a second address onto a second group of address lines in response to the second clock, a second decode circuit, coupled to the second group of address lines, to drive a second group of select lines, and a second selection circuit coupled to the second group of select lines, to select one or more cells of the second buffer in response to a third clock. In some example memories, the address circuit may include a counter. Some example memories may also include a data output coupled to the buffer to provide data from the one or more cells of the buffer selected by the selection circuit in response to a read command. Some example memories may also include a verification circuit coupled to the buffer to verify that data from the one or more cells of the buffer selected by the selection circuit has an expected value in response to a program or erase command. Any combination of the examples of this paragraph may be used in embodiments.

An example electronic system includes supervisory circuitry to generate a memory access, and at least one memory coupled to the supervisory circuitry. The at least one memory may include an even buffer to temporarily store data from an even memory array, an odd buffer to temporarily store data from an odd memory array, a clock circuit to generate alternating even clock periods and odd clock periods, an address circuit to generate an even address that changes in the even clock periods and an odd address that changes in the odd clock periods, even decode circuitry to decode the even address, odd decode circuitry to decode the odd address, even selection circuitry to select one or more cells of the even buffer during the odd clock periods based, at least in part, on the decoded even address to access the temporarily stored data in the even buffer, and odd selection circuitry to select one or more cells of the odd buffer during the even clock periods based, at least in part, on the decoded odd address to access the temporarily stored data in the odd buffer. Some example electronic systems may also include I/O circuitry, coupled to the supervisory circuitry, to communicate with an external device. In some example electronic systems, the electronic system may include a solid state drive. Some example electronic systems may also include even remap circuitry coupled between the address circuit and the even decode circuit, and odd remap circuitry coupled between the address circuit and the odd decode circuit. In some example electronic systems, the even and the odd remap circuitry both comprise content addressable memory. In some example electronic systems, the even decode circuit and the odd decode circuit both may include two or more 'n' to $2^n$ decoder circuits. In some example electronic systems, a 'n' to $2^n$ decoder circuit is coupled to a subset of 'n' address lines of the respective group of address lines and drives a set of $2^n$ respective select lines. In some example electronic systems, the even selection circuit and the odd selection circuit both may include logic coupled to at least a single line of a first set of $2^n$ select lines and a single line of a second set of $2^n$ select lines to select the one or more cells of the respective buffer. Any combination of the examples of this paragraph and the preceding paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. An electronic system comprising:
   supervisory circuitry to generate a memory access; and
   at least one memory coupled to the supervisory circuitry, the at least one memory comprising:
   an even buffer to temporarily store data from an even memory array;
   an odd buffer, separate and distinct from the even buffer, to temporarily store data from an odd memory array;
   a clock circuit to generate alternating even clock periods and odd clock periods;
   an address circuit to generate an even address that changes in the even clock periods and an odd address that changes in the odd clock periods;
   even decode circuitry to decode the even address;
   odd decode circuitry, separate and distinct from the even decode circuitry, to decode the odd address;
   even selection circuitry to select one or more cells of the even buffer during the odd clock periods based, at least in part, on the decoded even address to access the temporarily stored data in the even buffer;
   odd selection circuitry, separate and distinct from the even selection circuitry, to select one or more cells of the odd buffer during the even clock periods based, at least in part, on the decoded odd address to access the temporarily stored data in the odd buffer;
   even remap circuitry coupled between the address circuit and the even decode circuit; and
   odd remap circuitry, separate and distinct from the even buffer, coupled between the address circuit and the odd decode circuit;
   wherein the odd address is already provided at an output of the address circuit at a start of the odd clock period to be decoded during the odd clock period after the data for the even address is latched into the even buffer.

2. The electronic system of claim 1, further comprising; I/O circuitry, coupled to the supervisory circuitry, to communicate with an external device.

3. The electronic system of claim 1, wherein the electronic system comprises a solid state drive.

4. The electronic system of claim 1, wherein the even decode circuit and the odd decode circuit both comprise two or more 'n' to 2n decoder circuits, wherein a 'n' to 2n decoder circuit is coupled to a subset of 'n' address lines of the respective group of address lines and drives a set of 2n respective select lines; and
   wherein the even selection circuit and the odd selection circuit both comprise logic coupled to at least a single line of a first set of 2n select lines and a single line of a second set of 2n select lines to select the one or more cells of the respective buffer.

5. The electronic system of claim 1, comprise the even remap circuitry includes a first content addressable memory and the odd remap circuitry includes a second content addressable memory.

* * * * *